(12) United States Patent
Yamada et al.

(10) Patent No.: US 6,376,900 B1
(45) Date of Patent: Apr. 23, 2002

(54) SINGLE CRYSTAL SIC

(75) Inventors: Yoshimitsu Yamada; Kichiya Tanino; Toshihisa Maeda, all of Sanda (JP)

(73) Assignee: Nippon Pillar Packing Co., Ltd., Osaka (JP)

( * ) Notice: Subject to any disclaimer, the term of this patent is extended or adjusted under 35 U.S.C. 154(b) by 0 days.

(21) Appl. No.: 09/497,799

(22) Filed: Feb. 4, 2000

(51) Int. Cl.$^7$ ................................. H01L 23/58
(52) U.S. Cl. ........................ 257/629; 438/931
(58) Field of Search ................ 257/629, 632, 257/634, 635; 438/931, 455, 459, 478

(56) References Cited

U.S. PATENT DOCUMENTS 6,153,165 A * 11/2000 Tanino .................. 423/345
6,153,166 A * 11/2000 Tanino .................. 423/345

* cited by examiner

Primary Examiner—David Nelms
Assistant Examiner—Quoc Hoang
(74) Attorney, Agent, or Firm—Jones, Tullar & Cooper, P.C.

(57) ABSTRACT

In single crystal SiC 1, growing single crystal SiC 3 is integrally formed on a surface of a single crystal hexagonal (6H type) α-SiC substrate 2 used as a seed crystal. The number of micropipes 4A of the growing single crystal SiC 3 is less than that of the micropipes 4B of the single crystal α-SiC substrate 2, and the thickness t3 thereof is less than the thickness t2 of the single crystal α-SiC substrate 2, thereby making it possible to obtain the high quality-single crystal SiC wherein the number of the micropipes per unit area is less, thereby decreasing the distortion in the neighborhood of the micropipes. This can provide the high-quality single crystal SiC which can be practically used as a substrate wafer for fabricating a semiconductor device.

6 Claims, 3 Drawing Sheets

SINGLE CRYSTAL SiC

BACKGROUND OF THE INVENTION

1. Field of the Invention

The present invention relates to single crystal SiC, and more particularly to single crystal SiC which is used as a semiconductor substrate wafer for a high-temperature semiconductor element, an optical element, and a light-emitting element.

2. Description of the Prior Art

SiC (silicon carbide) is superior in heat resistance and mechanical strength, and also has good resistance to radiation. In addition, it is easy to perform the valence control of electrons and holes by doping an impurity. Moreover, SiC has a wide band gap (for example, single crystal 6H-SiC has a band gap of about 3.0 eV, and single crystal 4H-SiC has a band gap of about 3.26 eV). Therefore, it is possible to realize a high temperature, a high frequency, a withstand voltage, and a high resistance to environments which cannot be realized by existing semiconductor materials such as Si (silicon) and GaAs (gallium arsenide). For these reasons, single crystal SiC receives attention and is expected as a semiconductor material for a next-generation power device.

This kind of single crystal SiC is subjected to various kinds of treatments such as epitaxial growths, whereby the single crystal SiC is used as a substrate or the like in case that plural IC chips are produced on a wafer simultaneously.

As a method of producing the single crystal SiC which is used as the substrate wafer for producing a semiconductor device such as IC chip, known conventionally are the Achison method, the sublimation and recrystallization method (or the Raileygh method), and the improved sublimation and recrystallization method (or the improved Raileygh method). In the Achison method, a seed crystal substrate is heated by a high frequency electrode from the outer periphery thereof, whereby nuclei occur in the center portion of the seed crystal substrate so as to develop plural crystal growths which are spiral shaped around the seed crystal substrate. In the sublimation and recrystallization method (or the Raileygh method), SiC powder as a material is sublimated inside a graphite crucible so as to produce a sublimation gas, whereby the sublimation gas is recrystallized on a side of lower temperature portion inside of the graphite crucible. Furthermore, in the improved sublimation and recrystallization method (or the improved Raileygh method), a seed crystal is arranged on a side of the lower temperature portion inside the graphite crucible, and the gas sublimated from the SiC as the material is diffused to be transported within a closed space whereby it is recrystallized on the seed crystal whose temperature is set to be low.

In the Achison method of the above-described conventional production methods, however, a seed crystal substrate is heated over a long time period, whereby a single crystal is grown slowly, so that the crystal growth rate is very low. In addition, a large number of crystal nuclei are generated in an initial growth stage, and they propagate to an inner layer of the crystal as the crystal growth advances. Thus, it is not preferable in view of productivity and quality of the product to use the single crystal produced by the Achison method as semiconductor material such as IC. Therefore, as the production method of the single crystal SiC used for the semiconductor material, the Raileygh method and the improved Raileygh method are exclusively adopted.

However, in the single crystal SiC produced by the Raileygh method and the improved Raileygh method, which can accelerate the crystal growth, and enables the growth of a large size single crystal, many pinholes (whose number is substantially 100 pinholes/cm$^2$ in the current state) which have a diameter of several microns to dozens of microns are likely to remain in a growing crystal. Therefore, the single crystal SiC produced by the Raileygh method and the improved Raileygh method, has defects in view of quality. Such pin holes are called micropipe defects. Especially, in using it as the substrate wafer for fabricating the semiconductor device, many micropipes existing on the substrate wafer are fatal obstacles for fabricating the semiconductor device. In other words, in case of using the single crystal SiC produced by the Raileygh method and the improved Raileygh method as the substrate wafer, and forming an epitaxial layer on the single crystal SiC, the micropipes existing on the wafer are inherited to the epitaxial layer so as to be grown. As a result, a predetermined semiconductor device cannot be produced. Moreover, even if it can be forcedly produced, there is a problem wherein the necessary features of the semiconductor device itself cannot be obtained. This blocks a practical use of SiC which has superior characteristics as compared with other existing semiconductor materials such as Si and GaAs as described above.

SUMMARY OF THE INVENTION

The present invention has been conducted to address the above mentioned circumstances. It is an object of the present invention to provide extreme high-quality SiC which can be effectively used as a substrate wafer for fabricating a semiconductor device, in which the number of micropipes are few, and distortion in the neighborhood of the micropipes is decreased.

In order to achieve this object, single crystal SiC according to a first aspect of the present invention is characterized by having a structure of the single crystal SiC, in which single crystal SiC is formed on a single crystal SiC substrate via a single. crystal SiC layer which is substantially free from micropipes, and the number of micropipes per unit of area in the single crystal SiC substrate is less than that of micropipes per unit area in the single crystal SiC substrate. Single crystal SiC according to a second aspect of the present invention is characterized in that an upper layer of single crystal SiC substrate is formed as a single crystal SiC layer which is substantially free of the micropipes, and the number of micropipes per unit area in the upper layer of the single crystal SiC substrate is less than that of micropipes per unit area in a lower layer of the single crystal SiC substrate Additionally, single crystal SiC according to a third aspect of the present invention is characterized in that the number of micropipes per unit area is less than 50, and preferably less than 20 and it is formed so as to be practically used as substrate wafer for fabricating a semiconductor device.

The first and third aspects of the present invention as mentioned above, compared with the single crystal SiC produced by the Raileygh method and the improved Raileygh method, make it possible to obtain the high quality-single crystal SiC wherein the number of the micropipes per unit area is less, thereby decreasing the distortion in the neighborhood of the micropipes. In conventional single crystal SiC, a great number of micropipes have existed, thereby causing a fatal difficulty in producing a substrate wafer for fabricating a semiconductor device. Even if the substrate wafer is forcedly produced, the quality thereof deteriorates. Such conditions block a practical use of SiC, and especially the practical use of a substrate wafer for fabricating a semiconductor device. However, the present invention has an effect. In other words, the present invention makes the single crystal SiC according to the present invention practicable as a substrate wafer used for producing the semiconductor device. Furthermore, it has another effect of promoting practicability of the single crystal SiC which is superior in a high frequency, a withstand voltage, and a high resistance to environments which cannot be realized by existing semiconductor materials such as Si (silicon) and GaAs (gallium arsenide), and which is expected as the semiconductor material for power device.

Other objects and effects of the present invention will be clarified by the following description of preferred embodiments.

DETAILED DESCRIPTION OF THE PREFERRED EMBODIMENT

Herein after, an embodiment of the present invention will be described with reference to the drawings.

Figure 1:
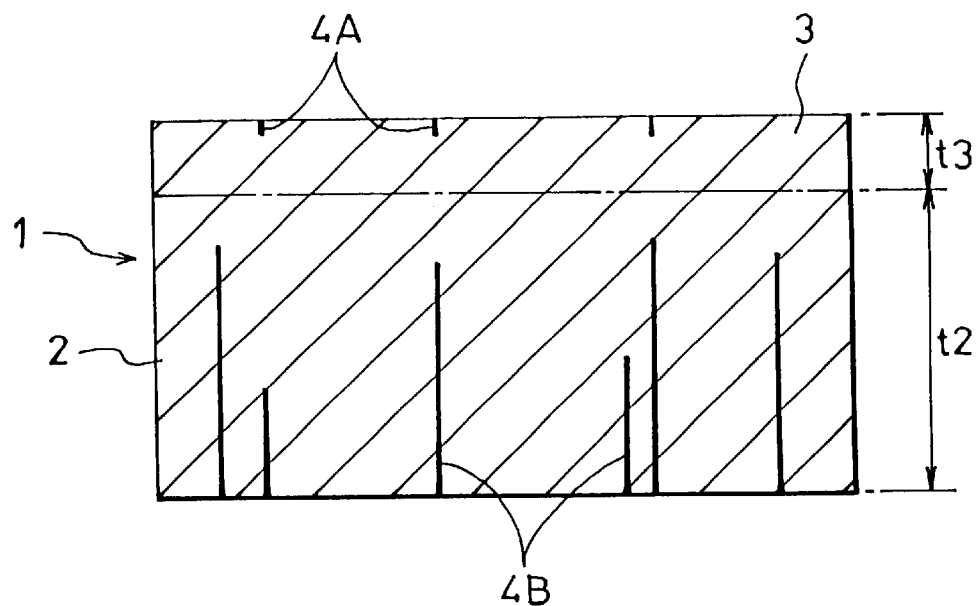
FIG. 1 is a schematic sectional view of single crystal SiC according to the present invention.

FIG. 1 is a sectional view illustrating schematically 1, which is a single crystal SiC according to an embodiment of the present invention. In the single crystal SiC 1, growing a single crystal SiC 3 is integrally formed on a surface of a single crystal hexagonal (6H type) α-SiC substrate 2 used as a seed crystal. The number of micropipes 4A of the growing single crystal SiC 3 is less than that of the micropipes 4B of the single crystal α-SiC substrate 2, and the thickness t3 thereof is less than the thickness t2 of the single crystal α-SiC substrate 2.

The single crystal SiC 1 shown in this embodiment is produced according to the following steps.

Figure 2:
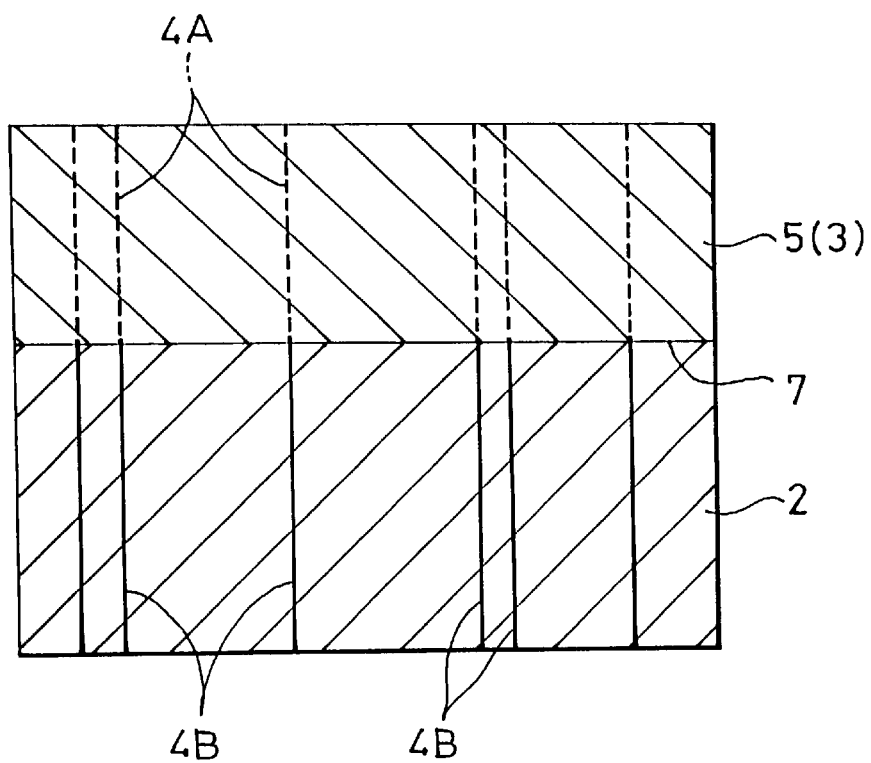
FIG. 2 is a schematic view of a state before a heat treatment for producing the single crystal SiC according to the present invention.

Namely, as shown in FIG. 2, on the surface of the single crystal hexagonal (6H type) α-SiC substrate 2 produced by the Raileygh method and the improved Raileygh method, and having a great number of micropipes 4B (whose number is substantially 100 micropipes/$cm^2$), as an example of the polycrystalline substance consisting of Si and C atoms, a polycrystalline cubic β-SiC substance 5 separately produced by thermal chemical vapor deposition on condition that the temperature and pressure are 1400° C. and 50 mmbar, under an atmosphere of $CH_3SiCl_3$ and $H_2$ gases, so as to have the thickness of substantial 500 μm, is closely fitted and piled. In this case, $SiO_2$, Si or the both of them may be interposed therebetween.

Next, the single crystal α-SiC substrate 2 and the polycrystalline β-SiC substance 5, which are closely fitted and piled thereon, are inserted in a resistance heating furnace made of carbon (not shown because it is well-known), and they are arranged so that the temperature on a side of the single crystal α-SiC substrate 2 may be kept to be lower than that of the polycrystalline β-SiC substance 5, and the periphery thereof is provided with SiC lumps (not shown), each SiC lump having a substantial size of an adzki-bean, so as to surround the single crystal α-SiC substrate 2 and the polycrystalline β-SiC substance 5 with the SiC lumps.

Under this state, a flow of an inert gas such as Ar, whose pressure is substantially 1 atom, is injected in the furnace, and the temperature inside the furnace 2100 to 2300° C. It is preferable that it takes an hour to raise the temperature at average velocity so that the temperature of the center of the furnace reaches 2200° C., and the temperature of 2200° C. is kept for about 3 hours. After that, the temperature is lowered by heat radiation. In other words, the heat treatment is performed in an atmosphere of the inert gas at atmospheric pressure, and in an atmosphere of a saturated SiC vapor pressure, whereby the polycrystalline β-SiC substance 5 is solid-phase-transformed into single crystal SiC 3 according to a crystal orientation of the single crystal α-SiC substrate 2, thereby integrally forming a single crystal substance with the substrate 2.

In an initial stage in growing the polycrystalline β-SiC substance 5 to single crystal SiC 3, the micropipes 4A as shown in dot-line in FIG. 2, which are inherited from a side of the single crystal α-SiC substrate 2, grow in also the single crystal SiC 3. However, in the heat treatment in the middle of or post to growing the single crystal SiC 3, Si and C atoms scattering and moving along an interface 7 between the single crystal α-SiC substrate 2 and the growing single crystal SiC 3, respectively inserted in the micropipes 4A, 4B in the both upper and lower sides so as to fill the holes. Finally, as shown in FIG. 3, this attains to produce single crystal α-6H-SiC substance 1' wherein the single crystal α-SiC substrate 2 is integrated with the growing single crystal SiC 3 so as to interpose a layer which is substantially free from micropipes in the both upper and lower sides of the interface 7.

Figure 3:
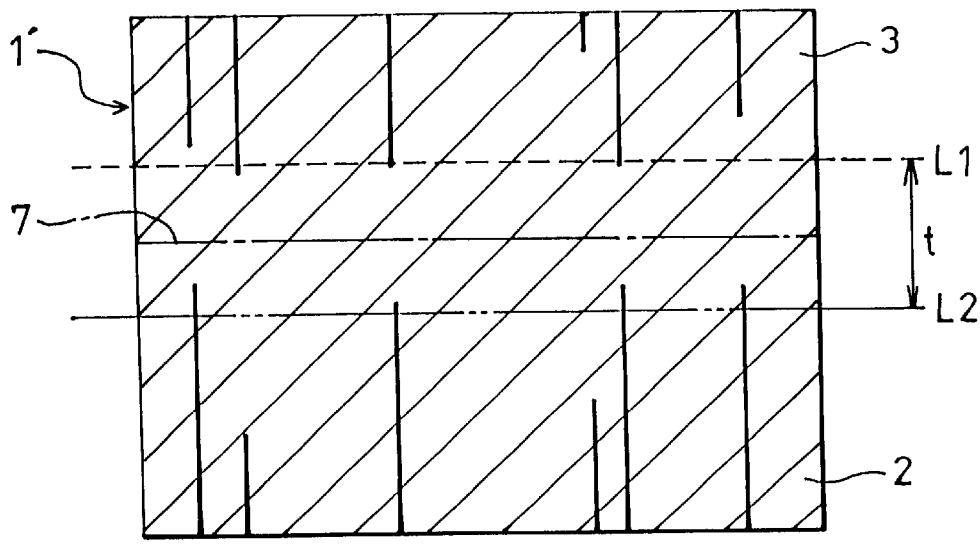
FIG. 3 is a schematic view of a state after a heat treatment is applied to the single crystal SiC according to the present invention.

The single crystal α-6H-SiC substance 1' is cut along a dotted line L1 in FIG. 3, and the cut surface is polished, thereby obtaining the single crystal SiC 1 in which the number of micropipes 4A per unit area on a side of the growing crystal SiC 3 is less than that of micropipes per unit area on a side of the single crystal α-SiC substrate 2 as shown in FIG. 1.

When such single crystal SiC 1 is used as a substrate wafer for fabricating semiconductor device, the necessary thickness t of the single crystal SiC 1 may be substantially 10μm which is enough. Therefore, as shown in FIG. 3, the single crystal α-6H-SiC substance 1' is cut along respectively a dotted line L1 and a two-dot chain line L2 which is positioned slightly below the interface 7, whereby it is possible to obtain the high-quality SiC 1 which is substantially free from the micropipes, and has the necessary thickness t as a substrate wafer for fabricating the semiconductor device.

Moreover, the cut line may not be limited to the each position of the dotted line L1 or the two-dot chain line L2 in FIG. 3. In other words, only if it is applicable for the substrate wafer for producing the semiconductor device, in which the number of micropipes per unit area is less than 50, preferably 20, the cut position is not limited.

Figure 4:
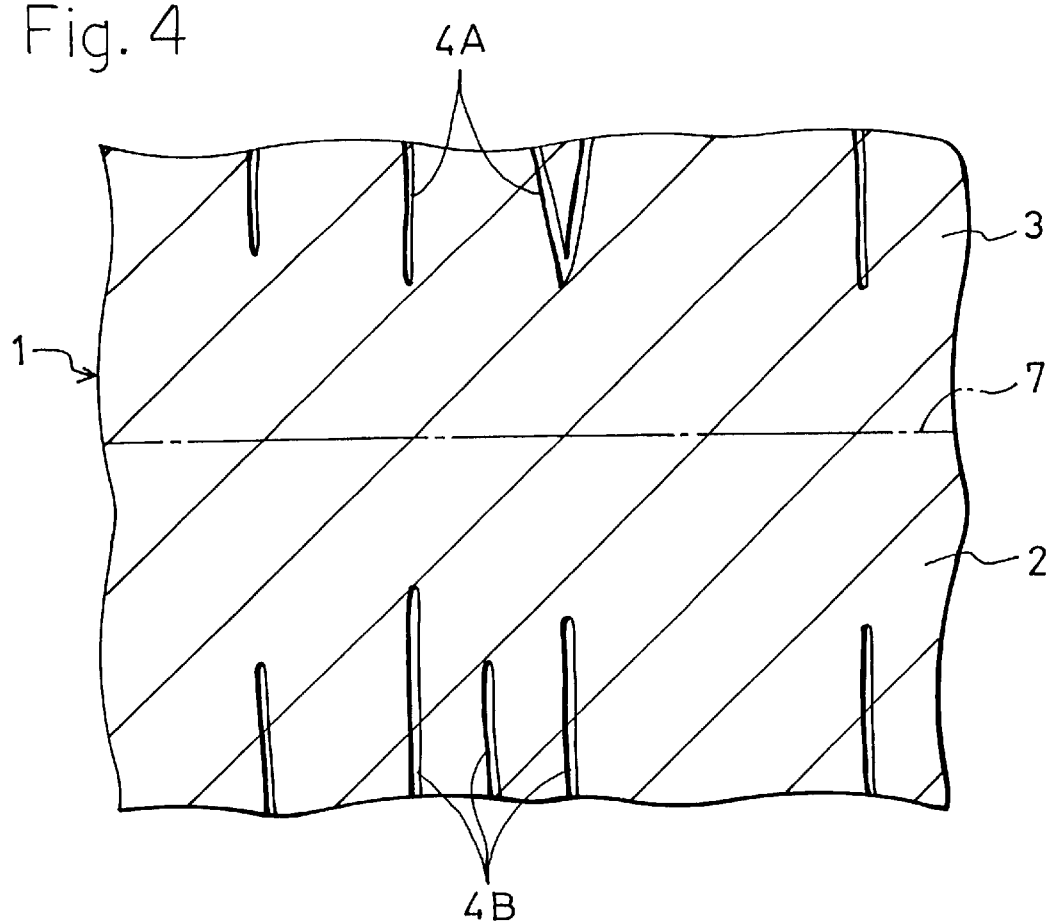
FIG. 4 is an enlarged sectional view of a main portion in observing the single crystal SiC according to the present invention through a polarization microscope under the transmission light.

Incidentally, the section of the single crystal SiC 1 obtained by the above mentioned way, is observed through a polarization microscope under the transmission light. As shown in FIG. 4, to a certain extent of the vertical width of the interface 7 as a boundary, the micropipes on a side of the single crystal α-SiC substrate 2 and on a side of the growing single crystal SiC 3 almost completely disappear, and the number of the micropipes in the upper and lower portions thereof is substantially the same as that of the micropipes under polarized light (namely, the number thereof is 0 to 20 per cm$^2$). In this view, also the inside of the micropipe is supposed to be single-crystallized.

Figure 5:
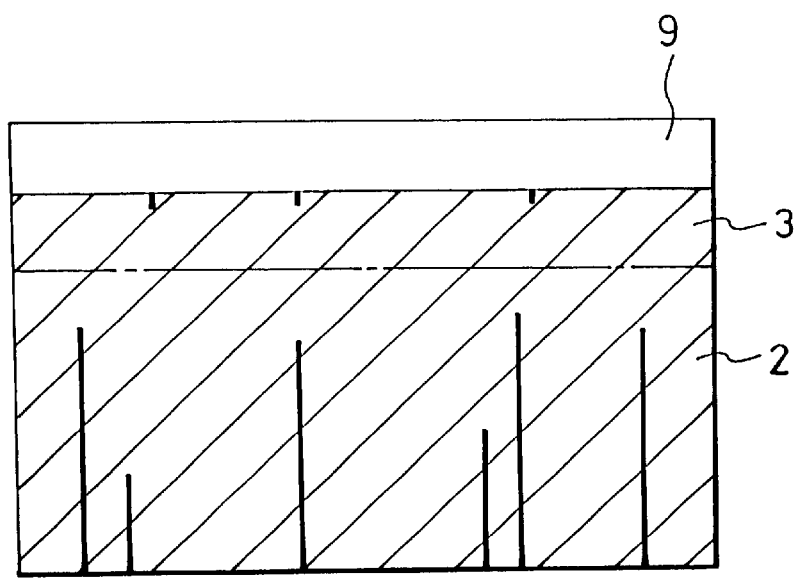
FIG. 5 is a sectional view of a first step in producing a semiconductor device by means of using the single crystal SiC as a substrate wafer.

Even if the single crystal SiC I having few micropipes is, for example, used as a substrate wafer 3 for fabricating a semiconductor device, and an epitaxial layer 9 shown in FIG. 5 is formed on the surface thereof by epitaxial growth, there is no or few micropipes on a surface layer on a side of the substrate wafer 3, whereby there is no possibility wherein the micropipes are inherited to the epitaxial layer 9 so as to be grown. As a result, it is possible to obtain the high-quality semiconductor device.

Figure 6:
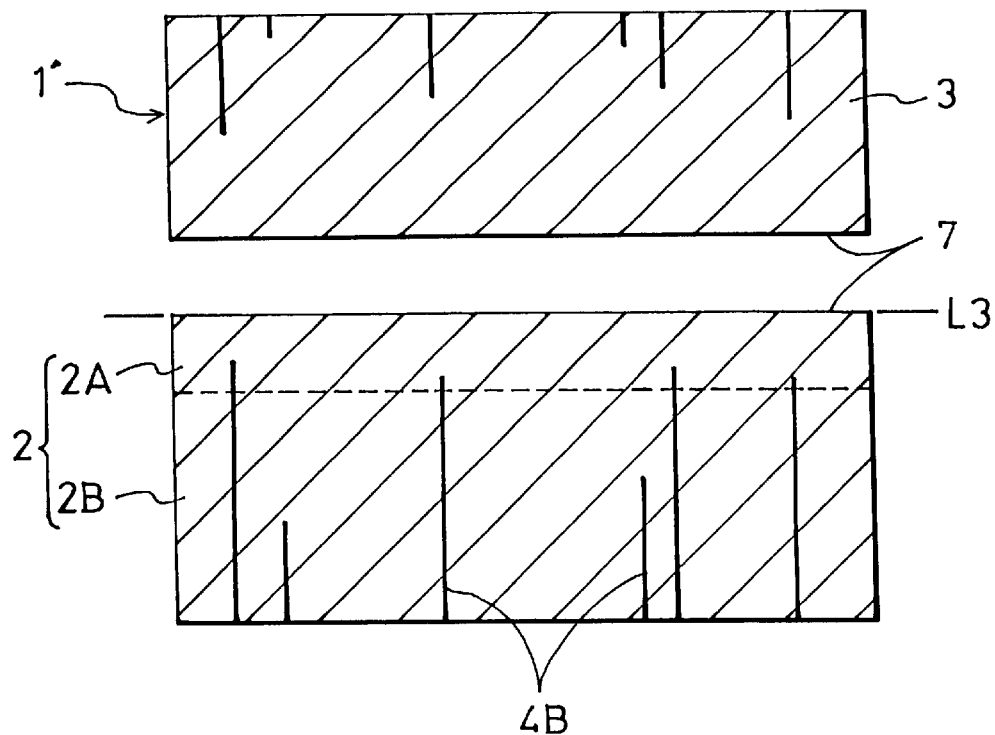
FIG. 6 is a schematic sectional view of the single crystal SiC according to another embodiment.

In the single crystal α-6H-SiC substance 1' produced according to the embodiment shown in FIG. 3, the number of the micropipes 4A in the upper layer 2A of the single crystal α-SiC substrate 2 is less than that of the micropipes in a lower layer 2B thereof. Then, as shown in FIG. 6, the single crystal α-6H-SiC substance 1' is cut according to a line L3 along the interface 7 between the single crystal α-SiC substrate 2 and the growing single crystal SiC 3, and the cut surface is polished thereby making it possible to obtain the single crystal SiC 1 used as a substrate wafer for producing the semiconductor device, which incurs no fatal damage in the production thereof.

Though single crystal 6H-SiC is used as the single crystal α-SiC substrate 1 in the above embodiment, single crystal 4H-SiC may be used.

Moreover, in the above mentioned embodiment, as the polycrystalline substance consisting of Si and C atoms, a polycrystalline cubic β-SiC substance grown by thermal chemical vapor deposition is used. Alternatively, even though a high purity SiC amorphous plate (whose purity is equal to or less than $10^{14 atm}/cm^3$) and a high purity SiC sintered material are employed not in growing layer means by thermal chemical vapor deposition but in simple fitting and piling means, the single crystal SiC which is the same high quality as the above one can be obtained.

What is claimed is:

1. A single crystal SiC structurally comprised of a grown single crystal SiC integrally formed on a single crystal SiC substrate, wherein:

said grown single crystal SiC is grown as a seed crystal by arranging the polycrystalline substance consisting of Si and C atoms so as to maintain it on one side of said substrate at a low temperature and subjected to a heat treatment; and said single crystal SiC substrate and said grown single crystal SiC are integrated with each other via a layer which defines an interface and which is substantially free from micropipes on both the upper and lower sides of said interface.

2. The single crystal SiC according to claim 1, wherein:
said grown single crystal SiC is thinner than said single crystal SiC substrate.

3. The single crystal SiC according to claim 1, wherein:
said single crystal SiC substrate has a polycrystalline cubic β-SiC substance grown thereon by thermal chemical vapor deposition, heat treated in an inert gas atmosphere with the inert gas at atmospheric pressure and in an atmosphere of a saturated SiC vapor pressure, whereby the polycrystalline substance is solid-phase-transformed into the single crystal SiC according to a crystal orientation of said single crystal SiC substrate, thereby growing the grown single crystal SiC.

4. The single crystal SiC according to claim 1, wherein:
said single crystal SiC substrate has an amorphous plate closely fitted and piled thereon and subjected to heat treatment, thereby growing the grown single crystal SiC.

5. The single crystal SiC according to claim 1, wherein:
said single crystal SiC substrate has a high-purity SiC sintered material closely fitted and piled thereon and subjected to heat treatment, thereby growing the grown single crystal SiC.

6. The single crystal SiC according to claim 1, wherein:
an upper layer of said single crystal SiC substrate is formed as a single crystal SiC layer substantially free from micropipes;
the number of micropipes per unit area in the upper layer of said single crystal SiC substrate is less than that in the lower level thereof.

* * * * *